United States Patent [19]
Kowshik

[11] Patent Number: 5,889,440
[45] Date of Patent: Mar. 30, 1999

[54] ADAPTIVE FREQUENCY COMPENSATION TECHNIQUE

[75] Inventor: Vikram Kowshik, San Jose, Calif.

[73] Assignee: Programmable Microelectronics Corp., San Jose, Calif.

[21] Appl. No.: 784,161

[22] Filed: Jan. 15, 1997

[51] Int. Cl.$^6$ ............................... H03B 27/00; H03L 7/00
[52] U.S. Cl. ............................................. 331/57; 331/1 A
[58] Field of Search ....................................... 331/57, 1 A

[56] References Cited

U.S. PATENT DOCUMENTS

| | | | |
|---|---|---|---|
| 4,298,971 | 11/1981 | Morokawa et al. | 331/57 |
| 5,440,277 | 8/1995 | Ewen et al. | 331/57 |
| 5,625,544 | 4/1997 | Kowshik et al. | 327/536 |

*Primary Examiner*—David C. Nelms
*Assistant Examiner*—Trong Phan
*Attorney, Agent, or Firm*—Skjerven, Morrill, MacPherson, Franklin & Friel LLP

[57] ABSTRACT

The frequency of a clocking signal is adjusted in response to fluctuations in the power supply voltage. In one embodiment, a control circuit has a plurality of clock input terminals each coupled between selected adjacent ones of the stages of a multiple-stage ring oscillator circuit and has an output clock terminal coupled to an input terminal of the ring oscillator circuit. In this manner, the control circuit may implement a plurality of loops each including a different variety of the stages of the ring oscillator circuit, wherein the clocking signal associated with each of the loops has a unique frequency. A plurality of trip voltages each being equal to a unique predetermined fraction of the power supply voltage are compared to a reference voltage. The control circuit selects, in response to the comparison of the trip voltages and the reference voltage, one of the loops mentioned above to provide its clocking signal to an output terminal of the oscillator. Thus, fluctuations in the power supply voltage are reflected in the trip voltages and result in a selection of a loop which has associated therewith a clocking signal having a frequency appropriate for the power supply voltage.

9 Claims, 2 Drawing Sheets

ADAPTIVE FREQUENCY COMPENSATION TECHNIQUE

CROSS REFERENCE TO RELATED APPLICATIONS

This application is related to the U.S. patent application Ser. No. 08/639,280 entitled "Charge Pump", filed on Apr. 25, 1996, which is now U.S. Pat. No. 5,625,544, issued Apr. 29, 1997.

BACKGROUND

1. Field of the Invention

This application relates generally to oscillators and specifically to adjusting the frequency of an oscillator circuit in response to changes in the power supply voltage.

2. Description of Related Art

Ring oscillator circuits are well known and may be used in a variety of circuit implementations. For example, charge pumps may employ a ring oscillator circuit to provide a clocking signal according to which the various stages of the charge pump are successively charged and discharged. The frequency of the clocking signal generated by the ring oscillator circuit typically varies over the operating voltage range of the power supply. As the power supply voltage decreases below approximately 3.0 volts, the frequency of the clocking signal generated by the ring oscillator circuit may, during such fluctuations described above, decrease to a level which degrades the performance of an associated circuit. For instance, when used as mentioned above with a charge pump circuit, the frequency of the clocking signal provided to the charge pump circuit may decrease to a level which undesirably limits the maximum current delivered to the charge pump, thereby retarding the charging of the charge pump.

The above-described problem of frequency variations has led to the development of ring oscillator circuits which generate a clocking signal having a frequency substantially independent of fluctuations in the magnitude of the power supply voltage. However, as the voltage of the associated power supply decreases, more current is required to sustain a constant charging of the charge pump circuit. Thus, there is a need to provide to charge pump circuit a clocking signal whose frequency increases with decreases in the voltage of the power supply.

SUMMARY

In accordance with the present invention, the frequency of a clocking signal is adjusted in response to fluctuations in the power supply voltage. In one embodiment, a control circuit has a plurality of clock input terminals each coupled between selected adjacent ones of the stages of a multiple-stage ring oscillator circuit and has an output clock terminal coupled to an input terminal of the ring oscillator circuit. In this manner, the control circuit may implement a plurality of clocking loops each of which includes a unique combination of the various stages of the ring oscillator circuit, where the clocking signal generated by each of the clocking loops may have a different frequency. A plurality of trip voltages each being equal to a unique predetermined fraction of the power supply voltage are compared to a reference voltage. The control circuit selects, in response to the comparison of the trip voltages and the reference voltage, one of the loops described above to provide its clocking signal to an output terminal of the oscillator. Thus, fluctuations in the power supply voltage are reflected in the trip voltages and result in a selection of a loop which has associated therewith a clocking signal having a frequency appropriate for the instantaneous voltage of the power supply.

DETAILED DESCRIPTION

Figure 1:
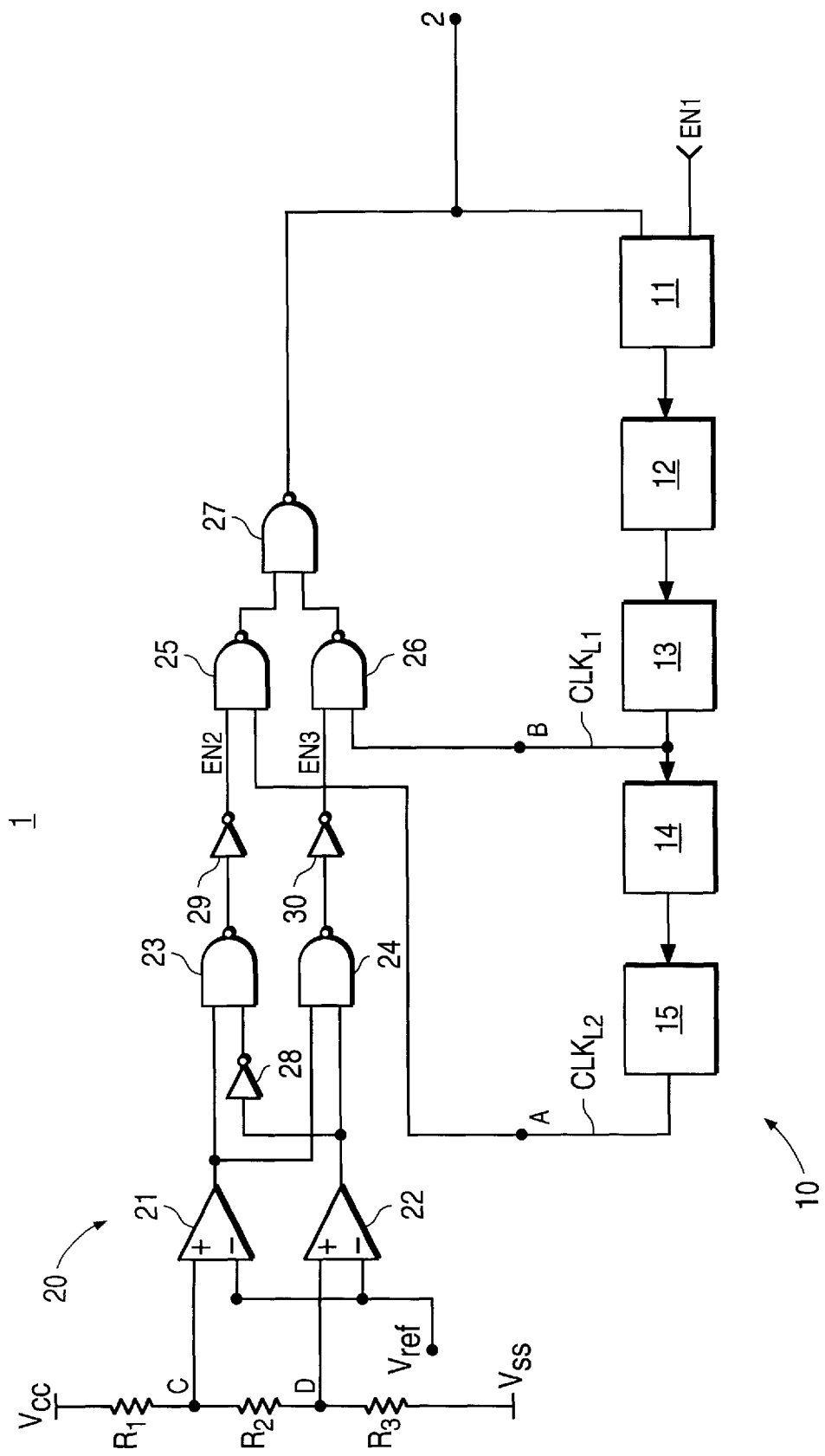
FIG. 1 is a schematic diagram of an oscillation system in accordance with the present invention.

The present invention is described below with reference to an oscillation system 1 for clarity only and is not to be construed as limited to the specific embodiment described herein. As shown in FIG. 1, oscillation system 1 includes a conventional ring oscillator circuit 10 having five stages 11–15 and a control circuit 20. Control circuit 20 has a first input terminal A coupled to the output terminal of stage 15 of ring oscillator circuit 10 and has a second input terminal B coupled between stages 13 and 14 of ring oscillator circuit 10. In this manner, two clocking loops L1 and L2 are formed. Loop L1 includes stages 11, 12, and 13 of ring oscillator circuit 10 and NAND gates 26 and 27 of control circuit 20. Loop L2 includes stages 11–15 of ring oscillator circuit 10 and NAND gates 25 and 27 of control circuit 20.

It is to be understood that in other embodiments the input and output terminals of control circuit 10 may be coupled to other nodes of ring oscillator circuit 10, and may also be used with ring oscillator circuits having a greater or fewer number of stages. Further, although discussed below as providing a clocking signal to an associated charge pump, actual embodiments may be employed to generate a clocking signal having an adjustable frequency for circuits or instruments other than charge pumps.

Control circuit 20 includes conventional op-amps 21 and 22, NAND gates 23–27, and inverters 28–30. Op-amps 21 and 22 may be any suitable structure capable of comparing an input voltage to a reference voltage, and NAND gates 23–27 may be any suitable structure capable of performing a logical NAND function. Note, however, that other combinational logic gates such as, for instance, NOR gates, may be employed to perform a similar function as that performed by NAND gates 23–27. Inverters 28–30 are preferably standard CMOS inverters, although any suitable circuit capable of inverting a logic signal level may be employed.

A resistor divider network formed by resistors $R_1$, $R_2$, and $R_3$ is coupled between a power supply $V_{cc}$ and ground potential and provides two trip voltages $V_{trip1}$ and $V_{trip2}$ at nodes C and D, respectively. Node C is coupled to the non-inverting terminal of op-amp 21, and node D is coupled to the non-inverting terminal of op-amp 22. A bandgap referenced voltage $V_{ref}$ of 1.1 volts is generated in a well known manner and provided to the inverting terminals of op-amps 21 and 22, as shown in FIG. 1. Reference voltage $V_{ref}$ should be independent of variations in the supply voltage $V_{cc}$ and of temperature and process variations. Note that in other embodiments the reference voltage $V_{ref}$ may assume values other than 1.1 volts, depending upon desired operating characteristics.

Op-amp 21 compares the trip voltage $V_{trip1}$ at node C with the voltage $V_{ref}$ and, in response thereto, provides an output signal to an input terminal of each of NAND gates 23 and 24. Op-amp 22 compares the trip voltage $V_{trip2}$ at node D with $V_{ref}$ and, in response thereto, provides an output signal to an input terminal of NAND gate 24. The logical complement of the output signal generated by op-amp 22 is provided as an input of NAND gate 23 via inverter 28. The output signal generated by NAND gate 23 is inverted by inverter 29 and provided as an enabling signal EN2 to an input terminal of NAND gate 25. The other input terminal of NAND gate 25 is coupled via node A to receive the output signal provided by stage 15 of ring oscillator 10. The output signal generated by NAND gate 24 is inverted by inverter 30 and provided as an enabling signal EN3 to an input terminal of NAND gate 26. The other input terminal of NAND gate 26 is coupled via node B to receive the output signal provided by stage 13 of ring oscillator 10. Together, feedback circuit 20 and ring oscillator 10 form two oscillation loops L1 and L2, where loop L1 is formed by stages 11–13 of ring oscillator 10 and NAND gates 26 and 27, and loop L2 is formed by stages 11–15 of ring oscillator 10 and NAND gates 25 and 27. When enabled, loop L1 generates a clocking signal $CLK_{L1}$ of frequency $f_{L1}$ and, when enabled, loop L2 generates a clocking signal $CLK_{L2}$ of frequency $f_{L2}$. Since loop L2 includes the stages 11–13 of loop L1 plus two additional stages 14 and 15, the frequency $f_{L2}$ of clocking signal $CLK_{L2}$ is smaller than the frequency $f_{L1}$ of clocking signal $CLK_{L1}$. The precise frequencies $f_{L1}$ and $f_{L2}$ of clocking signals $CLK_{L1}$ and $CLK_{L2}$, respectively, depend of course upon the configuration of individual one of stages 11–15 of ring oscillator circuit 10.

In one embodiment of the example shown in FIG. 1, resistors $R_1$–$R_3$ are 300 kΩ, 80 kΩ, and 120 kΩ, respectively, so as to cause op-amp 21 to trip (i.e., the signal output from op-amp 21 changes logic states) when $V_{cc}$ decreases below approximately 2.7 volts and so as to cause op-amp 22 to trip when $V_{cc}$ increases above 4.5 volts. In such an embodiment, the voltages at nodes C and D are both less than $V_{ref}$, i.e., less than 1.1 volts, as long as $V_{cc}$ is less than approximately 2.7 volts. In response thereto, op-amps 21 and 22 each output a logic low signal. These two logic low signals output from op-amps 21 and 22 force enabling signals EN2 and EN3 to a logic low state which, in turn force the output signal of NAND gates 25 and 26, respectively, to a logic high state. Clocking signals $CLK_{L1}$ and $CLK_{L2}$ are prevented from propagating through NAND gates 26 and 25, respectively, thereby effectively disabling respective loops L1 and L2. Accordingly, when $V_{cc}$ is less than approximately 2.5 volts, control circuit 20 prevents clocking signals $CLK_{L1}$ and $CLK_{L2}$ generated by loops L1 and L2, respectively, from appearing at output terminal 2 of oscillation system 1. In other words, when $V_{cc}$ is less than approximately 2.7 volts, oscillator circuit 1 does not generate an oscillating output signal and, thus, any associated circuit to oscillating circuit 1 is coupled such as, for instance, a charge pump, is disabled.

As $V_{cc}$ increases above approximately 2.7 volts, the voltage at node C rises above $V_{ref}$, thereby causing the output signal of op-amp 21 to transition to a logic high state. Note that op-amp 22 still outputs a logic low signal. The output signal of NAND gate 23 transitions to a logic low state, while the output signal of NAND gate 24 remains in a logic high state. Enabling signal EN2 transitions to a logic high state, thereby allowing clocking signal $CLK_{L2}$ to propagate through NAND gate 25. Enabling signal EN3 remains in a logic low state and, in forcing the output signal of NAND gate 26 to logic high, thereby disables loop L1 as discussed above. Clocking signal $CLK_{L2}$ then propagates through NAND gate 27 and appears at output terminal 2. In this manner, loop L2 is completed such that oscillator circuit 1 provides a clocking signal $CLK_{L2}$ having a frequency $f_{L2}$ to an associated circuit such as, for instance, a charge pump.

Where $V_{cc}$ increases above approximately 4.5 volts, the voltage at node D exceeds $V_{ref}$, thereby causing the output signal of op-amp 22 to transition to a logic high state. Since the voltage at node C must also be greater than $V_{ref}$, the output signal of op-amp 21 remains in a logic high state. As a result, the output signals of NAND gates 23 and 24 transition to logic high and logic low states, respectively. Thus, when $V_{cc}$ exceeds approximately 4.5 volts, enabling signal EN2 transitions to a logic low state and enabling signal EN3 transitions to a logic high state. Consequently, clocking signal $CLK_{L1}$ propagates through NAND gates 26 and 27, while clocking signal $CLK_{L2}$ is prevented from propagating through NAND gate 25. In this manner, loop L1 is completed such that oscillator circuit 1 provides a clocking signal $CLK_{L1}$ of frequency $f_{L1}$ at output terminal 2.

Figure 2:
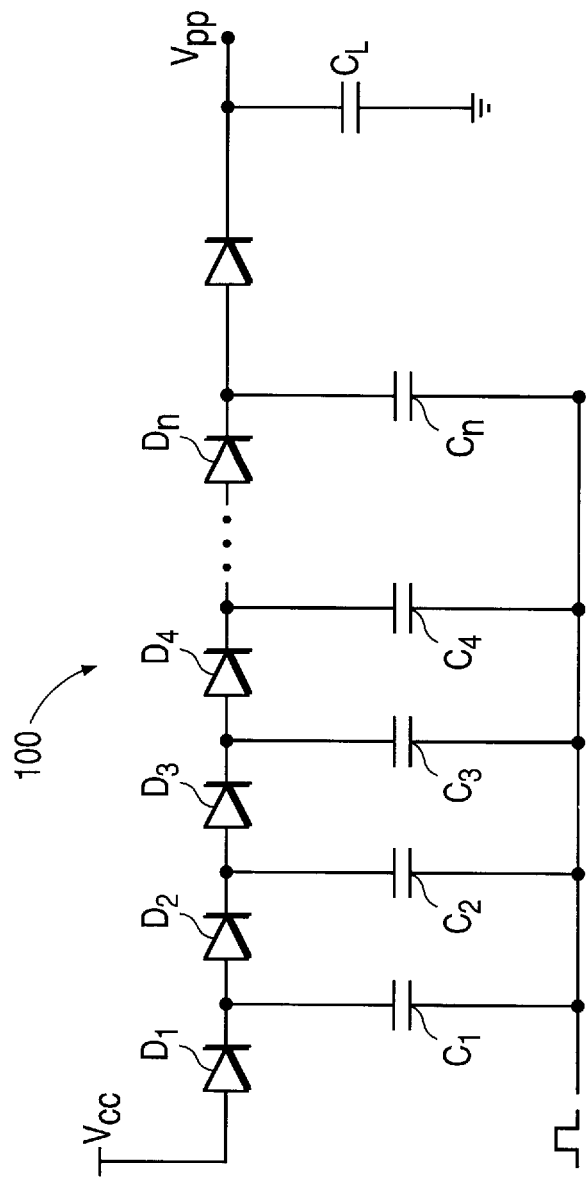
FIG. 2 is a schematic diagram of a conventional charge pump circuit.

As explained in detail in the above-referenced document entitled "Charge Pump", the output voltage $V_{pp}$ of a charge pump circuit such as, for instance, charge pump 100 shown in FIG. 2, is a function of the input power supply, the number of capacitor-diode pump stages, the clock frequency, and the load current at the output terminal of charge pump circuit 100. This relationship may be expressed as:

$$V_{out} = V_{CC} - N\left[\left(\frac{C}{C+C_s}\right)V_{CC} - V_{PN}\right] - V_{PN} - \frac{NI_{out}}{(C+C_s)f_e}$$

where $V_{cc}$ is the power supply, N is the number of pump stages, $V_{PN}$ is the forward voltage drop across each of diodes $D_1$–$D_N$, $I_{out}$ is the load current, $f_e$ is the effective clock frequency, and $C_s$ is the parasitic capacitance at each of the clocked nodes along the diode chain. It is apparent from the above equation that, assuming a constant output current from charge pump circuit 100, if the power supply voltage $V_{cc}$ decreases, the output voltage of the charge pump also decreases. This reduction in power supply voltage may, however, be compensated for by an appropriate corresponding increase in the effective clocking frequency. Thus, by allowing the frequency of a clocking signal to decrease with increases in the $V_{cc}$ and to increase with decreases in $V_{cc}$, embodiments in accordance with the present invention compensate for fluctuations in the power supply voltage, thereby enabling more efficient operation of, for instance, a charge pump circuit.

Applicant again emphasizes that the description provided above is merely illustrative of the present invention. Actual embodiments may be used with power supply voltages other than those mentioned above, resistor-divider networks providing different trip voltages, and a variety of suitable reference voltages depending, of course, upon desired operating characteristics. Embodiments may be used with any suitable ring oscillator circuit capable of providing clocking signals of different frequencies at various stages of the ring oscillator circuit. Further, it is to be understood that embodiments in accordance with the present invention may be suitably modified so as to be coupled to more than two nodes of a ring oscillator circuit in order to provide a greater number of trip voltages at which the frequency of the clocking signal generated by a suitable associated ring oscillator circuit may be adjusted in response to fluctuations in the power supply voltage.

While particular embodiments of the present invention have been shown and described, it will be apparent to those skilled in the art that changes and modifications may be made without departing from this invention in its broader aspects and, therefore, the appended claims are to encompass within their scope all such changes and modifications as fall within the true spirit and scope of this invention.

I claim:

1. A structure for adjusting, in response to fluctuations in a supply voltage, the frequency of a clocking signal generated by a ring oscillator having a plurality of stages, said structure comprising:

a power supply voltage;

a reference circuit providing a plurality of trip voltages of which being a predetermined fraction of said power supply voltage; and a control circuit having a first plurality of input terminals coupled to receive respective ones of said plurality of trip voltages, a second plurality of input terminals coupled between selective adjacent ones of said stages, and an output terminal coupled to an input terminal of said ring oscillator, where in response to increases in the magnitude of said power supply voltage, said control circuit enables additional ones of said stages of said ring oscillator to thereby decrease the frequency of said clocking signal generated by said ring oscillator.

2. The structure of claim 1, wherein said reference circuit comprises a voltage-divider network.

3. The structure of claim 1, wherein said control circuit comprises a plurality of comparator circuits each having a first input terminal coupled to receive respective ones of said plurality of trip voltages and a second input terminal coupled to receive a reference voltage.

4. The structure of claim 1, wherein said control circuit comprises combinational logic gates.

5. A method for adjusting the frequency of a clock signal generated by ring oscillator having a plurality of stages in response to fluctuations in a supply voltage, said method comprising the steps of:

providing a first voltage indicative of the magnitude of said power supply voltage;

comparing said first voltage to a reference voltage; and disabling a first number of said stages of said ring oscillator in response to said step of comparing such that said clocking signal has a first frequency.

6. The method of claim 5, further comprising the steps of:

providing a second voltage indicative of said magnitude of said supply voltage, said second voltage being greater than said first voltage;

comparing said second voltage to said reference voltage; and disabling a second number of said stages of said ring oscillator in response to said step of comparing such that said clocking signal has a second frequency.

7. The method of claim 6, wherein said second voltage is greater than said first voltage.

8. The method of claim 7, wherein said second number is greater than said first number.

9. The method of claim 8, wherein said first frequency is less than said second frequency.

* * * * *